(12) United States Patent
Hong et al.

(10) Patent No.: US 11,041,896 B2
(45) Date of Patent: Jun. 22, 2021

(54) PIEZOELECTRIC PROPERTY MEASURING APPARATUS FOR LIQUID OR VISCOUS MATERIAL

(71) Applicant: COSMAX, INC., Hwaseong-si (KR)

(72) Inventors: Sung Yun Hong, Goyang-si (KR); Ji Hui Jang, Seongnam-si (KR); Su Ji Kim, Seongnam-si (KR); Jun Bae Lee, Yongin-si (KR); Youn Joon Kim, Seoul (KR); Kweon Jong Yoo, Suwon-si (KR); Hui Yun Hwang, Andong-si (KR); Jun Hyeok Ahn, Daegu (KR); Sang Gyun Hwang, Andong-si (KR)

(73) Assignee: COSMAX, INC., Hwaseong-si (KR)

( * ) Notice: Subject to any disclaimer, the term of this patent is extended or adjusted under 35 U.S.C. 154(b) by 275 days.

(21) Appl. No.: 16/080,408

(22) PCT Filed: Jan. 24, 2017

(86) PCT No.: PCT/KR2017/000820
§ 371 (c)(1),
(2) Date: Aug. 28, 2018

(87) PCT Pub. No.: WO2018/021639
PCT Pub. Date: Feb. 1, 2018

(65) Prior Publication Data
US 2020/0379026 A1 Dec. 3, 2020

(30) Foreign Application Priority Data

Jul. 27, 2016 (KR) .................. 10-2016-0095633

(51) Int. Cl.
*G01R 29/22* (2006.01)
(52) U.S. Cl.
CPC .................. *G01R 29/22* (2013.01)

(58) Field of Classification Search
CPC ................................. G01R 29/22; G01N 3/30
(Continued)

(56) References Cited

U.S. PATENT DOCUMENTS

2002/0029621 A1  3/2002  Hajduk et al.
2009/0090168 A1  4/2009  Porter et al.

FOREIGN PATENT DOCUMENTS

JP  2006153535  6/2006
KR  20070105775  10/2007
(Continued)

OTHER PUBLICATIONS

Ahn, et al., Piezoelectric properties measurement method of the liquid crystal cosmetics, Proceedings of the KSME IT Merging Part 2016 Fall Annual Meeting, 2016, pp. 81-82.
(Continued)

*Primary Examiner* — Melissa J Koval
*Assistant Examiner* — Courtney G McDonnough
(74) *Attorney, Agent, or Firm* — Cantor Colburn LLP (57) ABSTRACT

Provided is a piezoelectric property measuring apparatus for a liquid or viscous material. The piezoelectric property measuring apparatus includes a fixing jig having an inner space and an opened space; an operating jig configured to close the opened region of the inner space; a first electrode and a second electrode; a driving module moving the operating jig according to a driving signal; a motion information measuring module measuring motion information of the operating jig; a charge amount measuring module measuring the charge amount through the first electrode and the second electrode; and a control module generating the driving signal for the driving module, supplying the driving signal to the driving module, receiving the motion information, receiving charge amount information of the closed space, and measuring a piezoelectric property of the sample (Continued)

by using the motion information and the charge amount information.

11 Claims, 9 Drawing Sheets

(58) Field of Classification Search
USPC ............... 324/109, 71.1, 451–456; 73/35.13
See application file for complete search history.

(56) References Cited

FOREIGN PATENT DOCUMENTS

| KR | 20110001476 | 1/2011 |
|----|-------------|--------|
| KR | 20160087582 | 7/2016 |

OTHER PUBLICATIONS

International Search Report—PCT/KR2017/000820 dated Jul. 21, 2017.

FIG. 9

PIEZOELECTRIC PROPERTY MEASURING APPARATUS FOR LIQUID OR VISCOUS MATERIAL

TECHNICAL FIELD

The present invention is made by Project Number S2341055 under the sponsorship of the Korea Small and Medium Business Administration. The research and management institute of the above project is KIAT (Korea Institute for Advancement of Technology), the research business name is "World Class 300 R&D", the research project name is "Development Of New Functional Material Of Controlling Skin Cell Receptor For K-Cosmetic Leading Functional Cosmetics And Development Of Optimal Skin Transfer Technology Containing The Material", the research management institute is Cosmax Co., Ltd., and the research period is 2013 Sep. 1-2017 Aug. 31.

The present invention relates to a piezoelectric property measuring apparatus, and more particularly, to a piezoelectric property measuring apparatus for measuring a physical property of a liquid or viscous material by measuring a charge amount that appears when a pressure is applied to the liquid or viscous material.

BACKGROUND ART

When a pressure is applied to a material, internal polarization is changed due to deformation (mechanical energy), and electrical charges (electrical energy) are generated. This is known as a piezoelectric phenomenon. The piezoelectric phenomenon was first observed in quartz by Jacques and Pierre Curie in 1880. Most of piezoelectric materials currently in use are inorganic materials such as Barium titanate ($BaTiO_3$), lead zirconate titanate (Pb(Zr, Ti) $O_3$, PZT) developed in the 1940s. In recent years, PVDF has attracted attention as a polymer piezoelectric material. Besides, solid-state materials such as metal oxides have been used. In industry, these materials are used in various fields by applying these materials to sensors, filters, resonators, actuators, speakers, energy harvesting, and the like. The completed products thereof such as mobile phones, humidifiers, lighters, watches, shoes, and expressways are used for major IT industry, energy industry, medical industry, and the like.

In order to measure physical properties of materials having such piezoelectric characteristics, it is necessary to measure a charge amount by a signal generated by applying a load or to measure an amount of deformation by a signal generated by applying an electric field.

In the case of measuring the piezoelectric properties of a solid-state thin film in the related art, it is impossible to measure a piezoelectric constant by a resonance method which is used as a standard in a sintered body due to the restriction by a substrate, and thus, it is necessary to measure the piezoelectric constant by a static method or a quasi-static method. These methods may be classified into methods such as an impulse method, a pneumatic method, and a vertical stress method using a static piezoelectric effect of measuring a charge amount induced when a load is applied to a sample and methods such as an interferometer method and an atomic force microscope (AFM) method using an inverse piezoelectric effect of measuring a degree of deformation of a sample when a voltage is applied. In the above-described methods, since a solid-state thin film is used as a sample, the initial shape can be maintained when a load is applied.

However, in the case of measuring a piezoelectric property with respect to a liquid or viscous material, since the shape is not maintained when a load is applied to the liquid or viscous material, it is difficult to measure the piezoelectric property by the methods of the related art.

Therefore, the present inventors intend to propose an apparatus capable of easily measuring a piezoelectric property of a liquid material having fluidity as well as a solid-state material.

SUMMARY OF THE INVENTION

Technical Problem

An object of the present invention is to provide a piezoelectric property measuring apparatus capable of measuring a piezoelectric property of a sample by inserting the sample as a liquid or viscous material in a closed space, applying a load, and measuring an electrical signal generated in the sample.

Solution to Problems

According to an aspect of the present invention, there is provided an piezoelectric property measuring apparatus including: a fixing jig configured so that an inner space capable of containing a sample is formed and a partial region of the inner space is opened; an operating jig configured to close the opened region of the inner space of the fixing jig to form a closed space and to be movable to the inner space of the fixing jig in order to apply a load to the sample contained in the closed space; a first electrode and a second electrode for measuring a charge amount of the closed space formed by the fixing jig and the operating jig; a driving module moving the operating jig according to a driving signal; a motion information measuring module attached to the operating jig and measuring motion information of the operating jig moved by the driving module; a charge amount measuring module measuring the charge amount through the first electrode and the second electrode and supplying the voltage signal; and a control module generating the driving signal for the driving module, supplying the driving signal to the driving module, receiving the motion information from the motion information measuring module, receiving charge amount information of the closed space from the charge amount measuring module, and measuring a piezoelectric property of the sample by using the motion information and the charge amount information.

In the piezoelectric property measuring apparatus according to the above aspect, it is preferable that the fixing jig and the operating jig are made of an insulating material.

In the piezoelectric property measuring apparatus according to the above aspect, the operating jig is formed to have a cylindrical shape or a polygonal shape, and the inner space of the fixing jig is formed to have a shape corresponding to that of the operating jig, so that the operating jig is configured to be reciprocatingly movable up and down in the inner space of the fixing jig; the motion information is a load applied to the closed space by the operating jig; and the first electrode and the second electrode are attached to a lower surface of the operating jig and a bottom surface of the inner space of the fixing jig, respectively, or the first electrode and the second electrode are both attached to a sidewall of the operating jig or an inner peripheral surface of the fixing jig and are separated from each other by a predetermined distance and electrically isolated from each other.

In the piezoelectric property measuring apparatus according to the above aspect, the operating jig is formed to have a cylindrical or polygonal shape of which lower surface has a conical shape, and the inner space of the fixing jig is formed to have a shape corresponding to that of the operating jig, of which bottom surface has a flat shape, so that the operating jig is configured to reciprocatingly move up and down and rotate with respect to the fixing jig; the motion information is a rotation angle of the operating jig rotating in the closed space; the first electrode is attached to a lower surface of the operating jig; the second electrode is attached to a bottom surface of the inner space of the fixing jig; and the first electrode attached to the lower surface of the operating jig is formed to have a conical shape which is in hermetical contact with the lower surface of the operating jig.

In the piezoelectric property measuring apparatus according to the above aspect, the operating jig includes: a main body having a through-hole formed at a center thereof and having a shape capable of closing the opened region of the fixing jig; and a moving member mounted in the through-hole of the main body so as to be movable up and down and rotatable, so that the moving member is configured to reciprocatingly move up and down and rotate in the inner space of the fixing jig; the moving member of the operating jig is separated by a predetermined distance from the inner peripheral surface of the fixing jig; the operating jig is configured to reciprocatingly move up and down and rotate with respect to the fixing jig; the motion information is a rotation angle of the operating jig rotating in the closed space; the first electrode is attached to the sidewall of the moving member of the operating jig; and the second electrode is attached to the inner peripheral surface of the fixing jig.

Effects of the Invention

In a piezoelectric property measuring apparatus according to the present invention, by forming a closed space by using a fixing jig and an operating jig, inserting a sample as a liquid or viscous material in the closed space, applying a load, and measuring a charge amount generated in the closed space of the sample by the applied, it is possible to measure a piezoelectric property of the liquid or viscous material.

Figure 9:
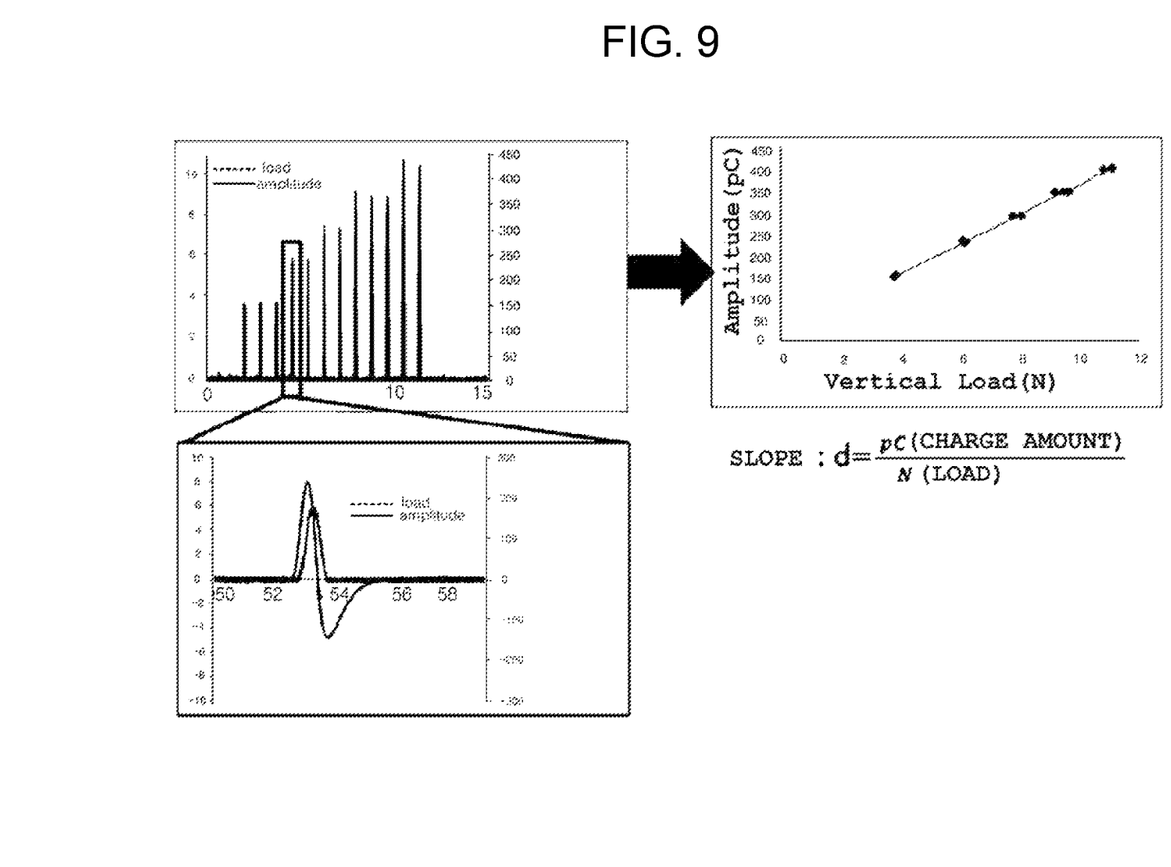
FIG. 9 is a graph illustrating a charge amount generated by applying a load to a sample in order to measure a piezoelectric coefficient d due to a piezoelectric phenomenon.

FIG. 9 is a graph illustrating the charge amount generated with respect to the load applied to the sample in order to measure a piezoelectric coefficient d due to the piezoelectric phenomenon. Referring to FIG. 9, the slope d can be obtained through the graph illustrating the charge amount (amplitude) generated with respect to the vertical load applied to the sample. The slope can be used as the piezoelectric coefficient.

BEST MODE FOR CARRYING OUT THE INVENTION

In a piezoelectric property measuring apparatus according to the present invention, a closed space capable of containing a sample as a liquid or viscous material is configured to formed by a fixing jig and an operating jig which is movable, and a charge amount generated from the sample is configured to be measured when a load or a deformation force is applied to the sample contained in the closed space.

Hereinafter, various embodiments of the piezoelectric properties measuring apparatus according to the present invention will be described in detail.

First Embodiment 1

Figure 1:
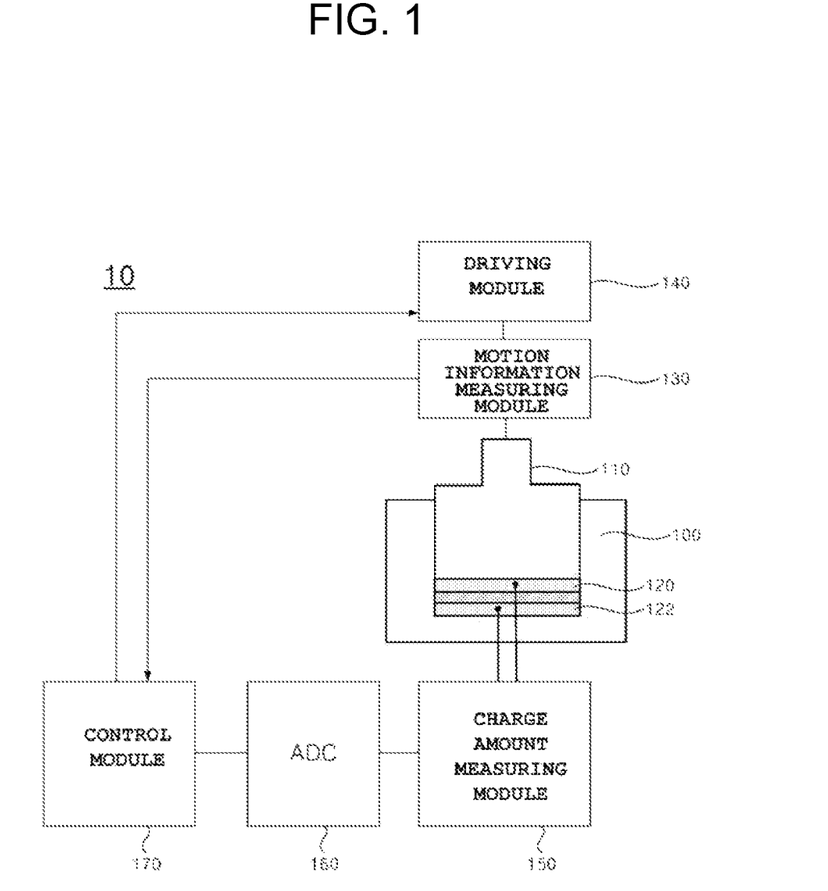
FIG. 1 is a block diagram illustrating a piezoelectric property measuring apparatus according to a first embodiment of the present invention.
Figure 2:
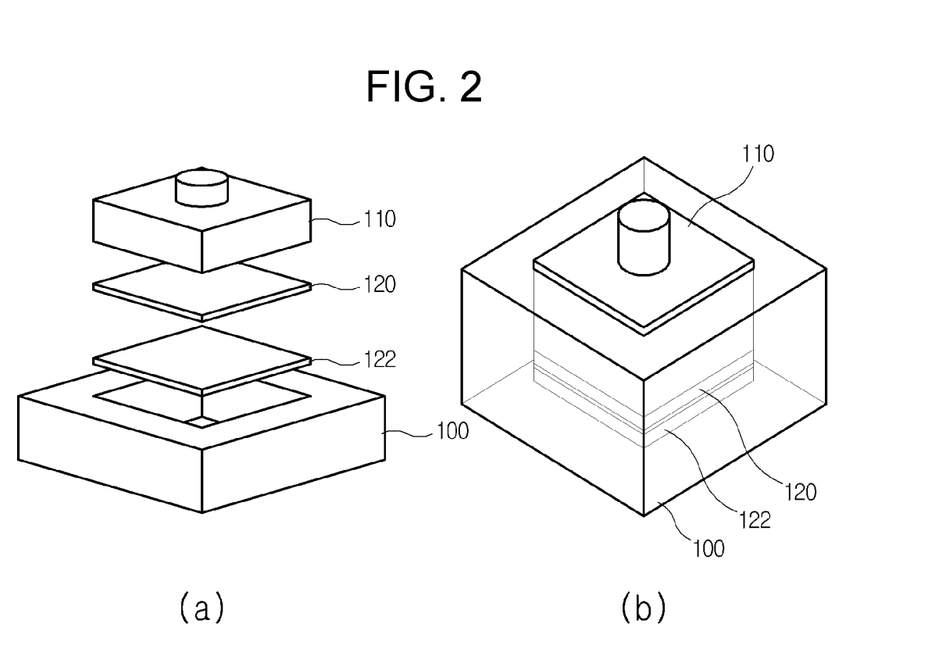
FIG. 2 is a perspective view illustrating a fixing jig, an operating jig, and electrodes in the piezoelectric property measuring apparatus according to the first embodiment of the present invention.

Hereinafter, structure and operation of a piezoelectric property measuring apparatus according to a first embodiment of the present invention will be described in detail with reference to FIGS. 1 and 2. FIG. 1 is a block diagram illustrating the piezoelectric property measuring apparatus according to the first embodiment of the present invention. FIG. 2 is a perspective view illustrating a fixing jig, an operating jig, and electrodes in the piezoelectric property measuring apparatus according to the first embodiment of the present invention. The piezoelectric property measuring apparatus according to the present embodiment is characterized in that a piezoelectric property of a sample is measured by using a load applied to the sample.

Referring to FIGS. 1 and 2, a piezoelectric property measuring apparatus 10 according to the present embodiment is configured to include a fixing jig 100, an operating jig 110, first and second electrodes 120 and 122, a driving module 140, a motion information measuring module 130, a charge amount measuring module 150, an ADC 160, and a control module 170. Hereinafter, the components will be described in detail.

The fixing jig 100 is configured so that an inner space capable of containing a sample is formed and a partial region of the inner space is opened.

The operating jig 110 is configured to close the opened region of the inner space of the fixing jig to form a closed space and to be movable to the inner space of the fixing jig in order to apply a load to the sample contained in the closed space. The inner space of the fixing jig and the outer peripheral surface of the operating jig are formed to have a polygonal or circular shape, and the shapes thereof correspond to each other so that the operating jig is movable up and down in the inner space of the fixing jig. Particularly, the inner space of the fixing jig is configured to be closed by the operating jig at the time of moving up and down.

The fixing jig and the operating jig are made of an insulating material and can be manufactured by a method such as casting, forging, injection molding, and rapid prototyping.

On the other hand, a sealing member (not illustrated) having an elastic force is provided between the inner peripheral surface of the fixing jig and the outer peripheral surface of the operating jig to improve the airtightness of the closed space which is formed by the fixing jig and the operating jig so as to contain the sample.

The first and second electrodes 120 and 122 measure the charge amount C in the closed space formed by the fixing jig and the operating jig. Preferably, the first electrode 120 is attached to the lower surface of the operating jig, and the second electrode 122 is attached to the bottom surface of the inner space of the fixing jig, so that the first and second electrodes 120 and 122 are arranged to face each other. The first and second electrodes are connected to an input terminal of the charge amount measuring module 150, so that the charge amount in the closed space can be measured in the motion information measuring module through the first and second electrodes. The first and second electrodes may be coupled or fabricated to an operating jig and a fixing jig by using a method such as fastening, bonding, welding, physical vapor deposition, and chemical vapor deposition.

Preferably, the fixing jig and the operating jig are made of an insulating material, and the first and second electrodes are made of a material having excellent electrical conductivity such as copper, gold, and silver.

The charge amount measuring module 150 converts the charge amount measured through the first and second electrodes into a voltage signal, amplifies the voltage signal, and outputs the amplified voltage signal to the ADC 160. The ADC 160 is an element that converts an analog signal into a digital signal and outputs the analog signal. The ADC 160 converts the analog signal supplied from the charge amount measuring module into a digital signal and supplies the digital signal to the control module.

The driving module 140 moves the operating jig in accordance with a driving signal supplied from the control module. In this embodiment, the driving module 140 is configured with an actuator which allows the operating jig to move up and down.

The motion information measuring module 130 is attached to the operating jig to measure the motion information of the operating jig generated by the driving module. In the present embodiment, the motion information measuring module 130 is configured with a load cell measuring the load applied to the operating jig and supplies the measured load value N as the motion information to the control module.

The control module 170 generates the driving signal for the driving module and supplies driving signal to the driving module. The control module 170 receives the motion information, that is, a load value N applied to the operating jig from the motion information measuring module and receives the charge amount C in the closed space from the charge amount measuring module. The control module 170 measures a piezoelectric coefficient $d_{33}$ as a piezoelectric property of the sample by using the following Equation 1 using the load value and the charge amount information and supplies the piezoelectric coefficient.

$$d_{33} = (\text{Charge Amount } C)/(\text{Load } N) \qquad [\text{Equation 1}]$$

Second Embodiment

Figure 3:
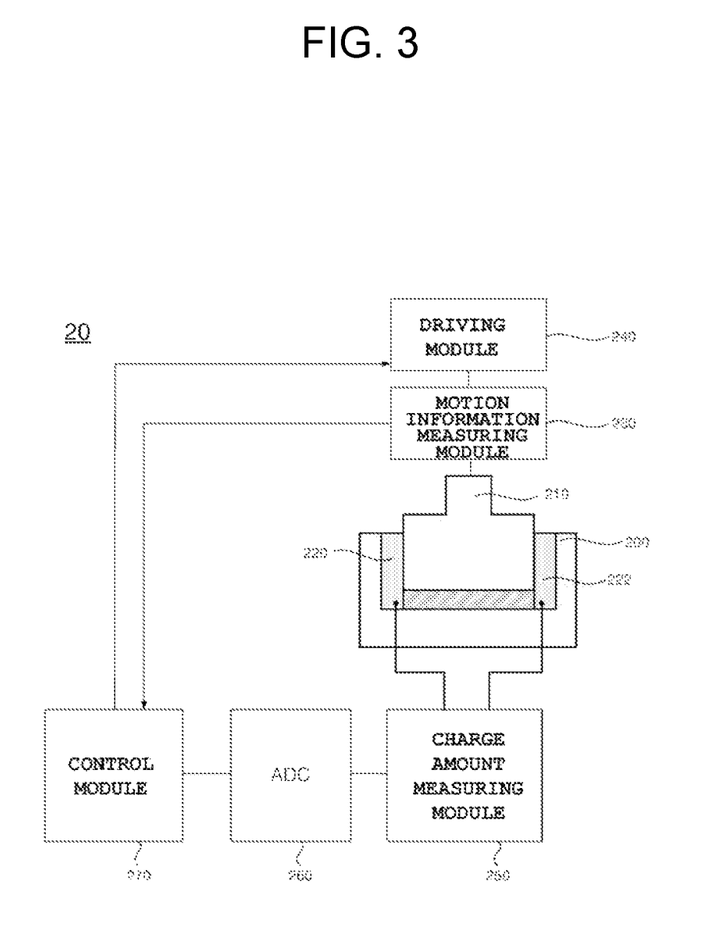
FIG. 3 is a block diagram illustrating a piezoelectric property measuring apparatus according to a second embodiment of the present invention.
Figure 4:
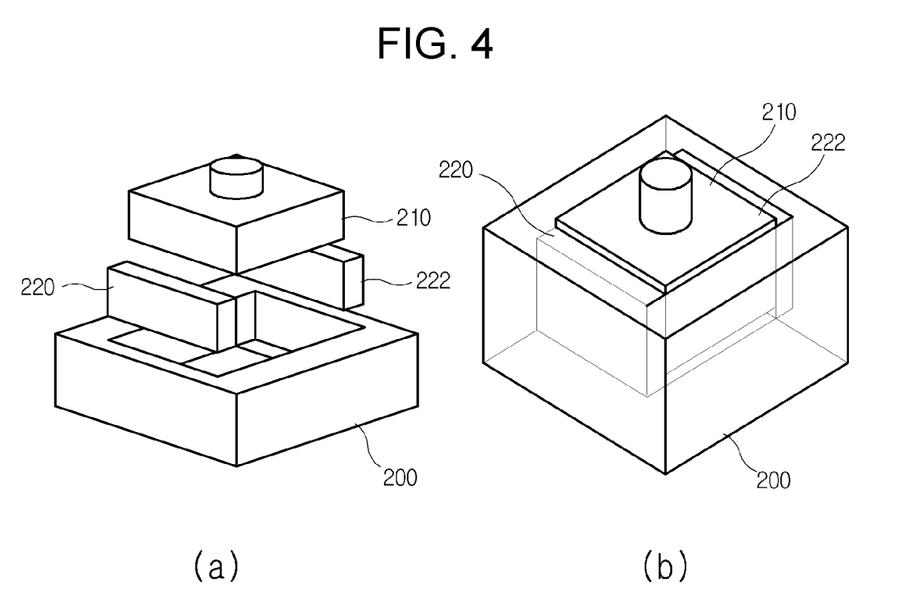
FIG. 4 is a perspective view illustrating a fixing jig, an operating jig, and electrodes in the piezoelectric property measuring apparatus according to the second embodiment of the present invention.

Hereinafter, a structure and operation of a piezoelectric property measuring apparatus according to a second embodiment of the present invention will be described in detail with reference to FIGS. 3 and 4. FIG. 3 is a block diagram illustrating the piezoelectric property measuring apparatus according to the second embodiment of the present invention. FIG. 4 is a perspective view illustrating a fixing jig, an operating jig, and electrodes in the piezoelectric property measuring apparatus according to the second embodiment of the present invention. The piezoelectric property measuring apparatus according to the present embodiment is characterized in that a piezoelectric property of a sample is measured by using a load applied to a sample.

Referring to FIGS. 3 and 4, the piezoelectric property measuring apparatus 20 according to the present embodiment is configured to include a fixing jig 200, an operating jig 210, first and second electrodes 220 and 222, a driving module 240, a motion information measuring module 230, a charge amount measuring module 250, an ADC 260, and a control module 270.

The piezoelectric property measuring apparatus according to the second embodiment of the present invention is the same as the piezoelectric property measuring apparatus according to the first embodiment except that the shapes and arrangements of the fixing jig, the operating jig, and the first and second electrodes are different. Hereinafter, components different from those of the first embodiment will be mainly described. The description about the same components as those of the first embodiment, for example, the driving module 240, the motion information measuring module 230, the charge amount measuring module 250, the ADC 260, and the control module 270 will be omitted.

Referring to FIGS. 3 and 4, the first and second electrodes 220 and 222 may be attached to facing sidewalls of the fixing jig or attached to facing sidewalls of the operating jig. The first and second electrodes are attached to the sidewalls of the fixing jig or the operating jig and are arranged to be separated from each other for electrical insulation between the first and second electrodes.

The control module 270 generates the driving signal for the driving module and supplies driving signal to the driving module. The control module 270 receives the motion information, that is, a load value N applied to the operating jig from the motion information measuring module and receives the charge amount C in the closed space from the charge amount measuring module. The control module 270 measures a piezoelectric coefficient $d_{31}$ as a piezoelectric property of the sample by using the following Equation 2 using the load value and the charge amount information and supplies the piezoelectric coefficient.

$$d_{31} = (\text{Charge Amount } C)/(\text{Load } N) \qquad [\text{Equation 2}]$$

Third Embodiment

Figure 5:
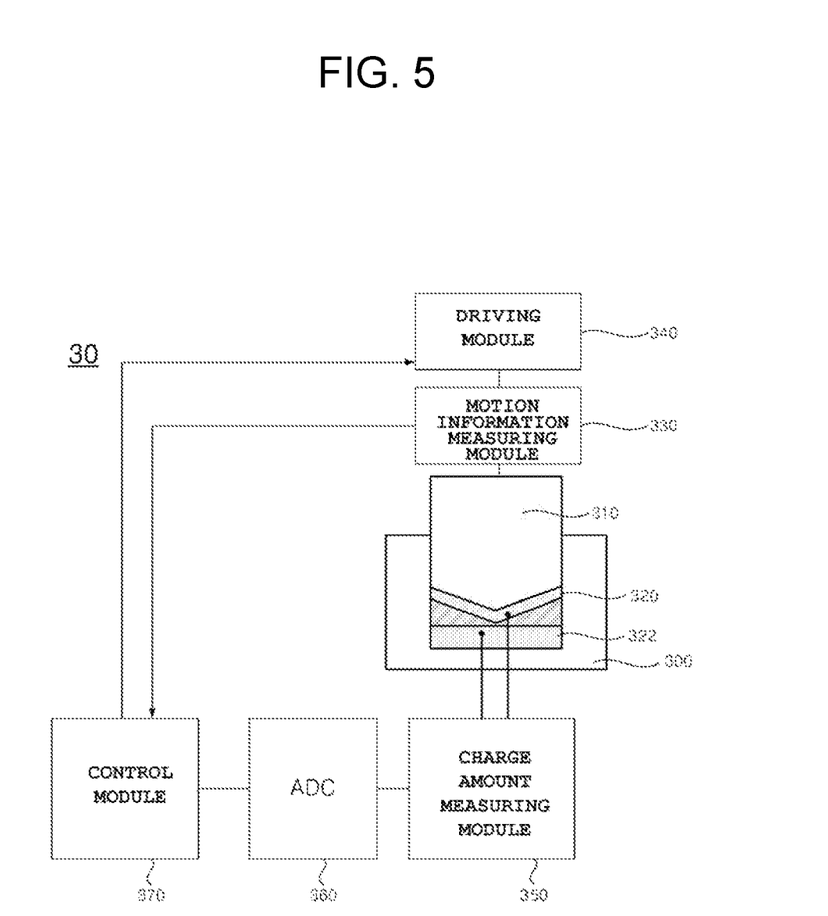
FIG. 5 is a block diagram illustrating a piezoelectric property measuring apparatus according to a third embodiment of the present invention.
Figure 6:
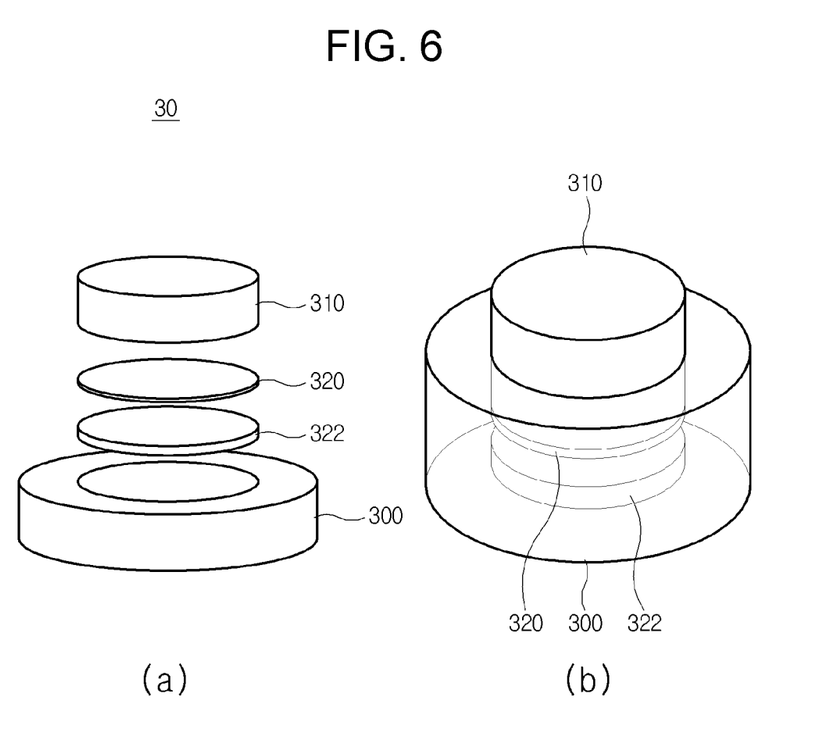
FIG. 6 is a perspective view illustrating a fixing jig, an operating jig, and electrodes in the piezoelectric property measuring apparatus according to the third embodiment of the present invention.

Hereinafter, structure and operation of a piezoelectric property measuring apparatus according to a third embodiment of the present invention will be described in detail with reference to FIGS. 5 and 6. FIG. 5 is a block diagram illustrating the piezoelectric property measuring apparatus according to the third embodiment of the present invention. FIG. 6 is a perspective view illustrating a fixing jig, an operating jig, and electrodes in the piezoelectric property measuring apparatus according to the third embodiment of the present invention. The piezoelectric property measuring apparatus according to the present embodiment is characterized in that a piezoelectric property of a sample is measured by using a shear force applied to the sample.

Referring to FIGS. 5 and 6, the piezoelectric property measuring apparatus 30 according to the present embodiment is configured to include a fixing jig 300, an operating jig 310, first and second electrodes 320 and 322, a driving module 340, a motion information measuring module 330, a charge amount measuring module 350, an ADC 360, and a control module 370. Hereinafter, the components will be described in detail.

The fixing jig 300 is configured so that an inner space capable of containing a sample is formed and a partial region of the inner space is opened.

The operating jig 310 is configured to close the opened region of the inner space of the fixing jig to form a closed space and to be movable to the inner space of the fixing jig in order to apply a load to the sample contained in the closed space. The inner space of the fixing jig and the outer peripheral surface of the operating jig are formed to have a circular shape, and the shapes thereof correspond to each other so that the operating jig is reciprocatingly movable up and down in the inner space of the fixing jig and rotatable in the left and right direction. Particularly, the inner space of the fixing jig is configured to be closed by the operating jig at the time of moving up and down and rotating. Particularly, the lower surface of the operating jig 310 is formed to have a conical shape.

The fixing jig and the operating jig are made of an insulating material and can be manufactured by a method such as casting, forging, injection molding, and rapid prototyping.

The first and second electrodes 320 and 322 measure the charge amount in the closed space formed by the fixing jig and the operating jig. Preferably, the first electrode 320 is attached to the lower surface of the operating jig, and the second electrode 322 is attached to the bottom surface of the inner space of the fixing jig, so that the first and second electrodes 320 and 322 are arranged to face each other. Preferably, the first electrode 320 is formed to have the same conical shape as the lower surface of the operating jig, so that the first electrode is attached to be in hermetical contact with the lower surface of the operating jig. The first and second electrodes are connected to an input terminal of the charge amount measuring module 350, so that the charge amount in the closed space can be measured in the motion information measuring module through the first and second electrodes. The first and second electrodes may be coupled or fabricated to an operating jig and a fixing jig by using a method such as fastening, bonding, welding, physical vapor deposition, and chemical vapor deposition.

Preferably, the fixing jig and the operating jig are made of an insulating material, and the first and second electrodes are made of a material having excellent electrical conductivity such as copper, gold, and silver.

The charge amount measuring module 350 converts the charge amount measured through the first and second electrodes into a voltage signal, amplifies the voltage signal, and outputs the amplified voltage signal to the ADC 360. The ADC 360 is an element that converts an analog signal into a digital signal and outputs the analog signal. The ADC 360 converts the analog signal supplied from the charge amount measuring module into a digital signal and supplies the digital signal to the control module.

The driving module 340 moves the operating jig in accordance with a driving signal supplied from the control module. In this embodiment, the driving module 340 is configured with a motor which applies a load to the operating jig in the vertical direction and rotates the operating jig in the left and right directions.

The motion information measuring module 330 is attached to the operating jig to measure the motion information of the operating jig by the driving module. In the present embodiment, the motion information measuring module 330 is configured with a rotation angle measuring device which measures a rotation angle of the operating jig and supplies the measured rotation angle as the motion information to the control module.

The control module 370 generates the driving signal for the driving module and supplies the driving signal to the driving module. The control module 370 receives the motion information, that is, a rotation angle value corresponding to the rotation of the operating jig from the motion information measuring module and receives the charge amount in the closed space from the charge amount measuring module. The control module 370 measures a piezoelectric coefficient $e_{51}$ as a piezoelectric property of the sample by using the following Equation 3 using a deformation rate calculated from the rotation angle value and the charge amount information and supplies the piezoelectric coefficient.

$$e_{51} = (\text{Charge Amount } C)/(\text{Deformation Rate } \gamma) \qquad \text{[Equation 3]}$$

On the other hand, the deformation rate according to the rotation angle can be obtained by the following equation (4).

$$\gamma = \frac{r\phi}{L} \qquad \text{[Equation 4]}$$

Herein, r is the radius of a cylinder corresponding to a rotating internal jig electrode, $\phi$ is the rotation angle, L is the height of the cylinder corresponding to the internal jig electrode, c is the distance between the internal jig and the external jig, and c is required to be less than L and r.

Fourth Embodiment

Figure 7:
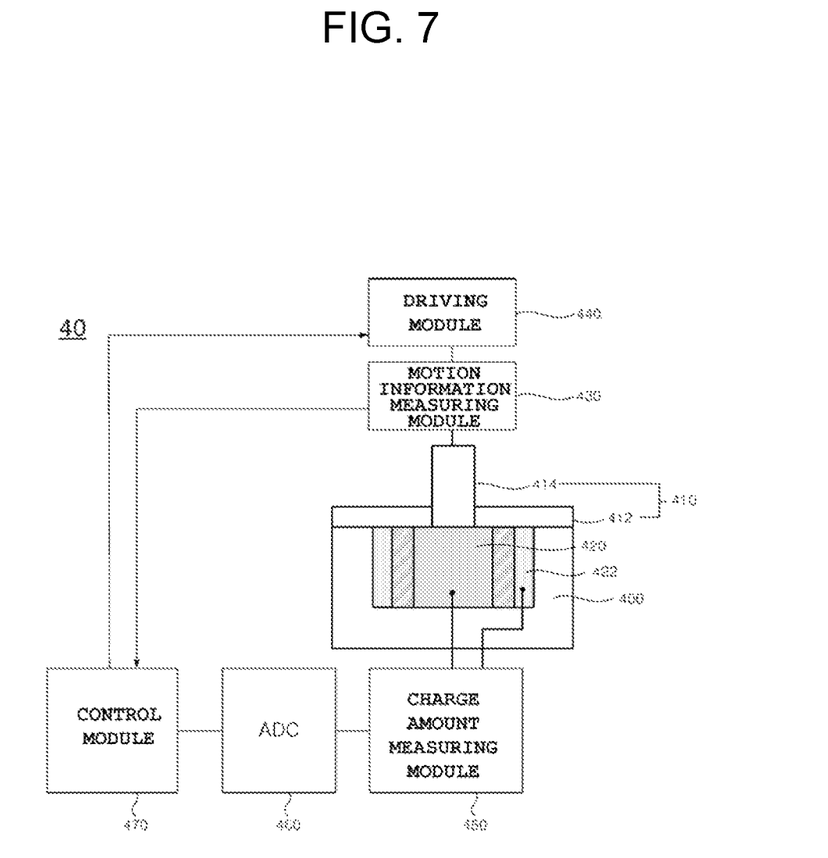
FIG. 7 is a block diagram illustrating a piezoelectric property measuring apparatus according to a fourth embodiment of the present invention.
Figure 8:
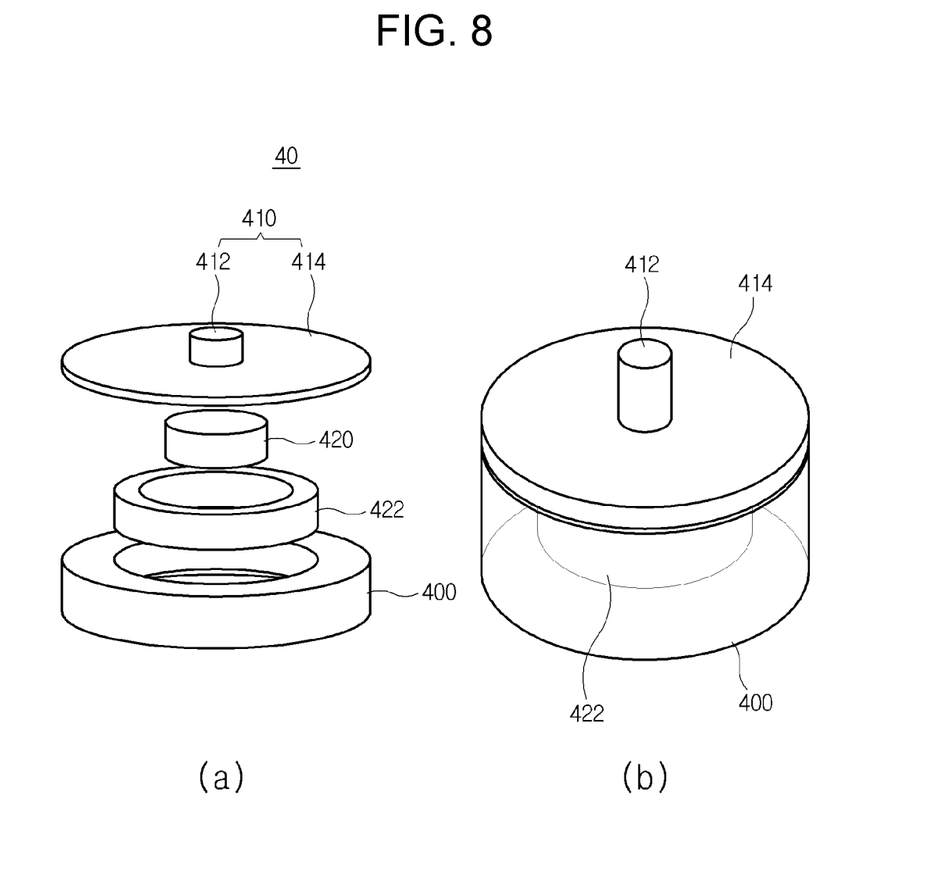
FIG. 8 is a perspective view illustrating a fixing jig, an operating jig, and electrodes in the piezoelectric property measuring apparatus according to the fourth embodiment of the present invention.

Hereinafter, structure and operation of the piezoelectric property measuring apparatus according to a fourth embodiment of the present invention will be described in detail with reference to FIGS. 7 and 8. FIG. 7 is a block diagram illustrating the piezoelectric property measuring apparatus according to the fourth embodiment of the present invention. FIG. 8 is a perspective view illustrating a fixing jig, an operating jig, and electrodes in the piezoelectric property measuring apparatus according to the fourth embodiment of the present invention. Similarly to the piezoelectric property measuring apparatus according to the third embodiment, the piezoelectric property measuring apparatus according to the present embodiment is characterized in that a piezoelectric property of a sample is measured by using a shear force applied to the sample.

Referring to FIGS. 7 and 8, the piezoelectric property measuring apparatus 40 according to the present embodiment is configured to include a fixing jig 400, an operating jig 410, first and second electrodes 420 and 422, a driving module 440, a motion information measuring module 430, a charge amount measuring module 450, an ADC 460, and a control module 470.

The piezoelectric property measuring apparatus according to the fourth embodiment of the present invention is the same as the piezoelectric property measuring apparatus according to the third embodiment except that the shapes and arrangements of the fixing jig, the operating jig, and the first and second electrodes are different. Hereinafter, components different from those of the third embodiment will be mainly described. The description about the same components as those of the third embodiment, for example, the driving module 440, the motion information measuring module 430, the charge amount measuring module 450, the ADC 460, and the control module 470 will be omitted.

Referring to FIGS. 7 and 8, the fixing jig 400 is configured so that an inner space containing a sample is formed and an upper portion thereof is opened.

The operating jig 410 includes a disk-shaped main body 412 having a through-hole formed at the center thereof and a moving member 414 arranged in the through-hole of the main body. The operating jig is arranged in the opened upper portion of the fixing jig 400. The main body 412 is fixed to the upper portion of the fixing jig. The moving member 414 is connected to the driving module 440 so that the moving member can rotate in the left and right directions while moving up and down in the vertical direction. Therefore, the operating jig is rotated in the left and right directions while applying a load to the sample in the closed space in the vertical direction.

The first electrode 420 is formed to have a cylindrical shape and is attached on the lower surface of the moving member of the operating jig 410. The second electrode 422 is arranged along the inner peripheral surface of the fixing jig 400. The first electrode and the second electrode are arranged to be separated from each other by a predetermined distance for electrical insulation. For this reason, the width of the cylinder of the first electrode is preferably adjusted.

The control module 370 generates the driving signal for the driving module and supplies the driving signal to the driving module. The control module 370 receives the motion information, that is, a rotation angle value corresponding to the rotation of the operating jig from the motion information measuring module and receives the charge amount C in the closed space from the charge amount measuring module. The control module 370 measures a piezoelectric coefficient $e_{51}$ as a piezoelectric property of the sample by using the following Equation 5 using a deformation rate calculated from the rotation angle value and the charge amount information and supplies the piezoelectric coefficient.

$$e_{51} = (\text{Charge Amount } C)/(\text{Deformation Rate } \gamma) \quad [\text{Equation 5}]$$

While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

The invention claimed is:

1. A piezoelectric property measuring apparatus comprising:
    a fixing jig configured so that an inner space capable of containing a sample is formed and a partial region of the inner space is opened;
    an operating jig configured to close the opened region of the inner space of the fixing jig to form a closed space and to be movable to the inner space of the fixing jig in order to apply a load to the sample contained in the closed space;
    a first electrode and a second electrode for measuring a charge amount of the closed space formed by the fixing jig and the operating jig;
    a driving module moving the operating jig according to a driving signal;
    a motion information measuring module attached to the operating jig and measuring motion information of the operating jig moved by the driving module;
    a charge amount measuring module measuring the charge amount through the first electrode and the second electrode, converting the charge amount into a voltage signal, amplifying the voltage signal, and outputting the voltage signal; and
    a control module generating the driving signal for the driving module, supplying the driving signal to the driving module, receiving the motion information from the motion information measuring module, receiving charge amount information of the closed space from the charge amount measuring module, and measuring a piezoelectric property of the sample by using the motion information and the charge amount information,
    wherein the piezoelectric property measuring apparatus measures piezoelectric property for a liquid material or viscous material.

2. The piezoelectric property measuring apparatus according to claim 1, wherein the fixing jig and the operating jig are made of an insulating material.

3. The piezoelectric property measuring apparatus according to claim 1, wherein the operating jig is configured to be reciprocatingly movable up and down with respect to the fixing jig, and the motion information includes information of a load applied to the closed space by the operating jig.

4. The piezoelectric property measuring apparatus according to claim 3,
    wherein the operating jig is formed to have a cylindrical shape or a polygonal shape, and the inner space of the fixing jig is formed to have a shape corresponding to that of the operating jig, so that the operating jig is configured to be reciprocatingly movable up and down in the inner space of the fixing jig, and
    wherein the motion information is a load applied to the closed space by the operating jig.

5. The piezoelectric property measuring apparatus according to claim 4,
    wherein the first electrode and the second electrode are attached to a lower surface of the operating jig and a bottom surface of the inner space of the fixing jig, respectively, or
    wherein the first electrode and the second electrode are both attached to a sidewall of the operating jig or an inner peripheral surface of the fixing jig and are separated from each other by a predetermined distance and electrically isolated from each other.

6. The piezoelectric property measuring apparatus according to claim 1, wherein the operating jig is configured to be reciprocatingly movable up and down and rotating motion with respect to the fixing jig, and the motion information includes information of a rotation angle of the operating jig which rotates in the closed space.

7. The piezoelectric property measuring apparatus according to claim 6, wherein the operating jig is formed to have a cylindrical shape of which lower surface has a conical shape, and the inner space of the fixing jig is formed to have a shape corresponding to that of the operating jig, of which bottom surface has a flat shape, so that the operating jig is configured to reciprocatingly move up and down and rotate in the inner space of the fixing jig.

8. The piezoelectric property measuring apparatus according to claim 7,
- wherein the first electrode is attached to a lower surface of the operating jig,
- wherein the second electrode is attached to a bottom surface of the inner space of the fixing jig, and
- wherein the first electrode attached to the lower surface of the operating jig is formed to have a conical shape which is in hermetical contact with the lower surface of the operating jig.

9. The piezoelectric property measuring apparatus according to claim 6, wherein the operating jig includes:
- a main body having a through-hole formed at a center thereof and having a shape capable of closing the opened region of the fixing jig; and
- a moving member mounted in the through-hole of the main body so as to be movable up and down and rotatable, so that the moving member is configured to reciprocatingly move up and down and rotate in the inner space of the fixing jig, and
- wherein the moving member of the operating jig is separated by a predetermined distance from the inner peripheral surface of the fixing jig.

10. The piezoelectric property measuring apparatus according to claim 9,
- wherein the first electrode is attached to a sidewall of the moving member of the operating jig, and
- wherein the second electrode is attached to an inner peripheral surface of the fixing jig.

11. The piezoelectric property measuring apparatus according to claim 1, further comprising an additional sealing member between the fixing jig and the operating jig.

\* \* \* \* \*